United States Patent
Li (10) Patent No.: US 12,520,436 B2
(45) Date of Patent: Jan. 6, 2026

(54) CIRCUIT BOARD ASSEMBLY AND MANUFACTURING METHOD THEREOF

(71) Applicants: HongQiSheng Precision Electronics (QinHuangdao) Co., Ltd., Hebei Province (CN); Avary Holding (Shenzhen) Co., Ltd., Shenzhen (CN); Garuda Technology Co., Ltd., New Taipei (TW)

(72) Inventor: Cheng-Jia Li, Shenzhen (CN)

(73) Assignees: HongQiSheng Precision Electronics (QinHuangdao) Co., Ltd., Hebei (CN); Avary Holding (Shenzhen) Co., Ltd.; Shenzhen (CN); Garuda Technology Co., Ltd., New Taipei (TW)

( * ) Notice: Subject to any disclaimer, the term of this patent is extended or adjusted under 35 U.S.C. 154(b) by 295 days.

(21) Appl. No.: 18/497,429

(22) Filed: Oct. 30, 2023

(65) Prior Publication Data

US 2025/0142737 A1    May 1, 2025

(51) Int. Cl.
*H05K 3/46*    (2006.01)
*H05K 1/02*    (2006.01)
*H05K 1/05*    (2006.01)

(52) U.S. Cl.
CPC .......... *H05K 3/4673* (2013.01); *H05K 1/056* (2013.01); *H05K 2203/0278* (2013.01); *H05K 2203/104* (2013.01)

(58) Field of Classification Search
CPC .... H05K 1/0236; H05K 1/056; H05K 3/4673; H05K 2203/0278; H05K 2203/104
USPC ......................................................... 361/790
See application file for complete search history.

(56) References Cited

U.S. PATENT DOCUMENTS

2020/0119490 A1* 4/2020 Weis ................... H01R 12/716
2023/0089258 A1* 3/2023 Hoang ................... H05K 7/142
                                                              361/787

FOREIGN PATENT DOCUMENTS

CN         101242714 A       8/2008
KR         101520846 B1 *    5/2015 ......... H05K 13/0015

* cited by examiner

*Primary Examiner* — Nathan Milakovich
(74) *Attorney, Agent, or Firm* — MUNCY, GEISSLER, OLDS & LOWE, P.C.

(57) ABSTRACT

A circuit board assembly includes a first circuit board. The first circuit board includes a first substrate, a first circuit structure, a first magnetic layer and a connecting pillar. The first circuit structure is connected to the first substrate. The first magnetic layer is connected to the first circuit structure and makes the first circuit structure be arranged between the first magnetic layer and the first substrate. The first magnetic layer is not electrically connected to the first circuit structure. The connecting pillar is connected to the first circuit structure. The connecting pillar extends in a direction from the first circuit structure toward the first magnetic layer and through the first magnetic layer, and the connecting pillar is electrically connected to the first circuit structure.

15 Claims, 10 Drawing Sheets

CIRCUIT BOARD ASSEMBLY AND MANUFACTURING METHOD THEREOF

BACKGROUND

Technical Field

The present disclosure relates to a circuit board assembly and a manufacturing method thereof. More particularly, the present disclosure relates to a circuit board assembly which is assembled through magnetic force, and a manufacturing method thereof.

Description of Related Art

Due to the rapid development of technology, the printed circuit boards continuously develop into a trend of high compactness and high reliability. Therefore, the connecting technique between different circuit boards becomes more and more important. The conventional connecting technique about circuit board includes the methods such as anisotropic conductive film (ACF) connection, HotBar connection and board to board (BTB) connection. However, the aforementioned connecting technique still has their technical limits for the developing requirements of integration with high compactness in the future. Moreover, when using the methods such as anisotropic conductive film connection, HotBar connection and board to board connection, a certain space on the circuit board is need to be reserved for assembling the connecting elements. Also, it brings limitations and defects to the assembling of circuit boards as using the connecting elements for connection.

If the aforementioned connecting technique is used, the conducting layer will be partially exposed on the circuit board, which is easily damaged by water or moisture. Therefore, an additional waterproofing process (such as coating with waterproof glue) is required to make the circuit board have waterproof effects. Moreover, the solder paste used in HotBar connection or the connecting elements of board to board connection contains toxic substances or pollutants, which can easily cause harm to the environment.

SUMMARY

According to one aspect of the present disclosure, a circuit board assembly includes a first circuit board. The first circuit board includes a first substrate, a first circuit structure, a first magnetic layer and a connecting pillar. The first circuit structure is connected to the first substrate. The first magnetic layer is connected to the first circuit structure and makes the first circuit structure be arranged between the first magnetic layer and the first substrate. The first magnetic layer is not electrically connected to the first circuit structure. The connecting pillar is connected to the first circuit structure. The connecting pillar extends in a direction from the first circuit structure toward the first magnetic layer and through the first magnetic layer, and the connecting pillar is electrically connected to the first circuit structure.

According to another aspect of the present disclosure, a manufacturing method of a circuit board assembly includes the following steps. A first circuit board is provided. The first circuit board includes a first substrate, a first circuit structure, a first magnetic layer and a connecting pillar. The first circuit structure is connected to the first substrate. The first magnetic layer is connected to the first circuit structure and makes the first circuit structure be arranged between the first magnetic layer and the first substrate. The first magnetic layer is not electrically connected to the first circuit structure. The connecting pillar is connected to the first circuit structure. The connecting pillar extends in a direction from the first circuit structure toward the first magnetic layer and through the first magnetic layer, and the connecting pillar is electrically connected to the first circuit structure. A second circuit board is provided. The second circuit board includes a second circuit structure, a second magnetic layer and at least one assembling hole. The second magnetic layer is disposed on the second circuit structure. The assembling hole forms at the second magnetic layer and makes the second circuit structure be partially exposed in the assembling hole. An attracting magnetic force generated between the first magnetic layer and the second magnetic layer is used to assemble the second circuit board and the first circuit board, the connecting pillar is inserted into the assembling hole, and the connecting pillar electrically connected to the second circuit structure.

BRIEF DESCRIPTION OF THE DRAWINGS

The present disclosure can be more fully understood by reading the following detailed description of the embodiment, with reference made to the accompanying drawings as follows.

DETAILED DESCRIPTION

The following disclosure provides many different embodiments or examples, for implementing different features of the provided subject matter. Specific examples of elements, values, operations, materials, configurations and the like are described below to simplify the present disclosure. These are, of course, merely examples and are not intended to be limiting. Other elements, values, operations, materials, configurations and the like are also considered. For example, in the following description, forming a first feature over a second feature may include an embodiment in which the first and second features are formed in direct contact, and may also include an embodiment in which additional features may be formed between the first and second features, such that the first and second features may not be in direct contact. In addition, the present disclosure may repeat reference numerals and/or letters in the various examples. This repetition does not indicate a relationship between the various embodiments and/or configurations discussed.

In the following description, in order to clearly present the technical features of the present disclosure, the dimensions (such as length, width, thickness, and depth) of elements (such as layers, films, substrates, and areas) in the drawings will be enlarged in unusual proportions, and the number of some elements might decrease. Accordingly, the description and explanation of the following embodiments are not limited to the quantities, sizes and shapes of the elements presented in the drawings, but should cover the sizes, shapes, and deviations of the two due to actual manufacturing processes and/or tolerances. For example, the flat surface shown in the drawings may have rough and/or non-linear characteristics, and the acute angle shown in the drawings may be round. Therefore, the elements presented in the drawings in this case which are mainly for illustration are intended neither to accurately depict the actual shape and quantity of the elements nor to limit the scope of patent applications in this case.

Figure 1:
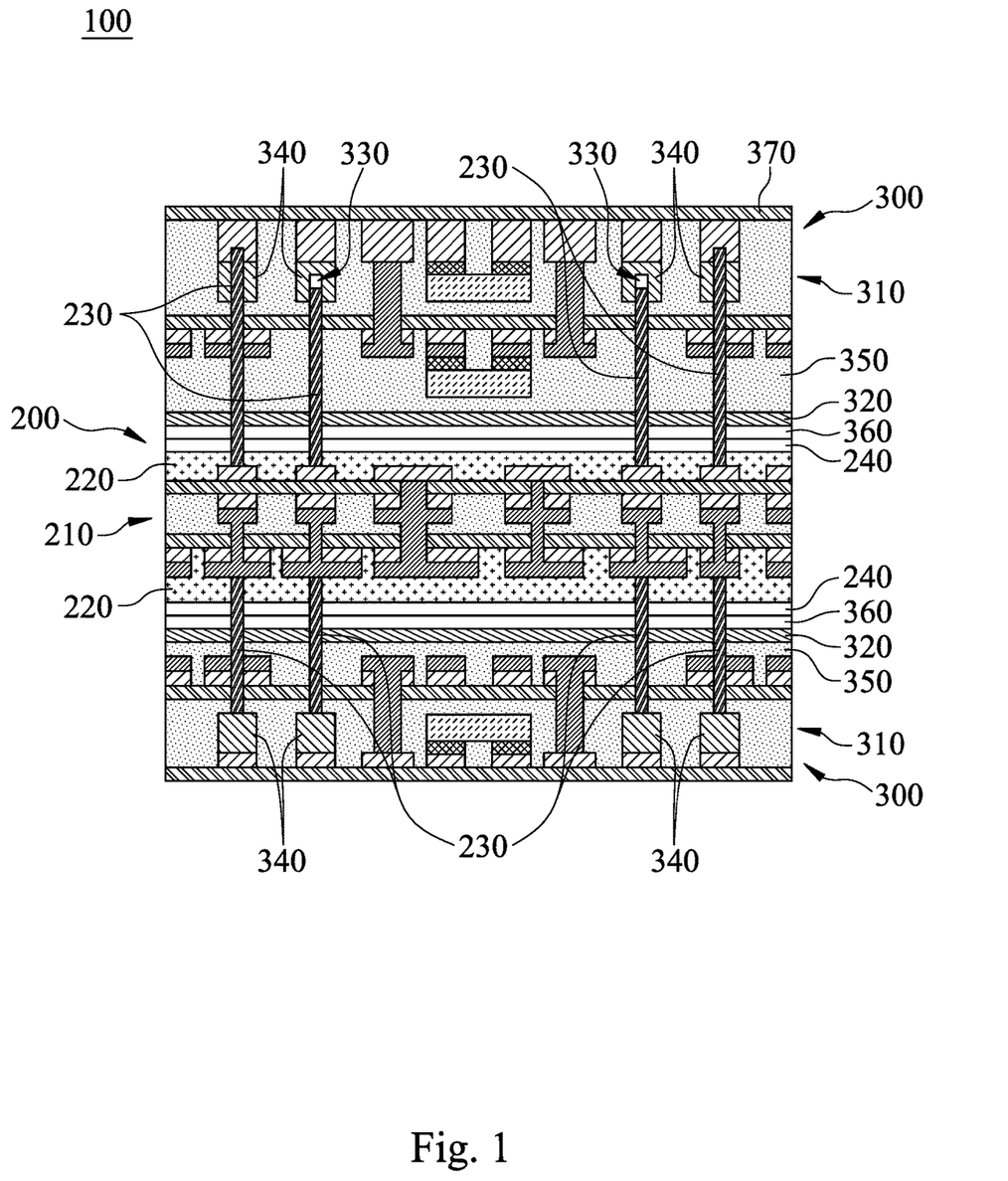
FIG. 1 shows a cross-sectional schematic view of a circuit board assembly according to an embodiment of the present disclosure.
Figure 2:
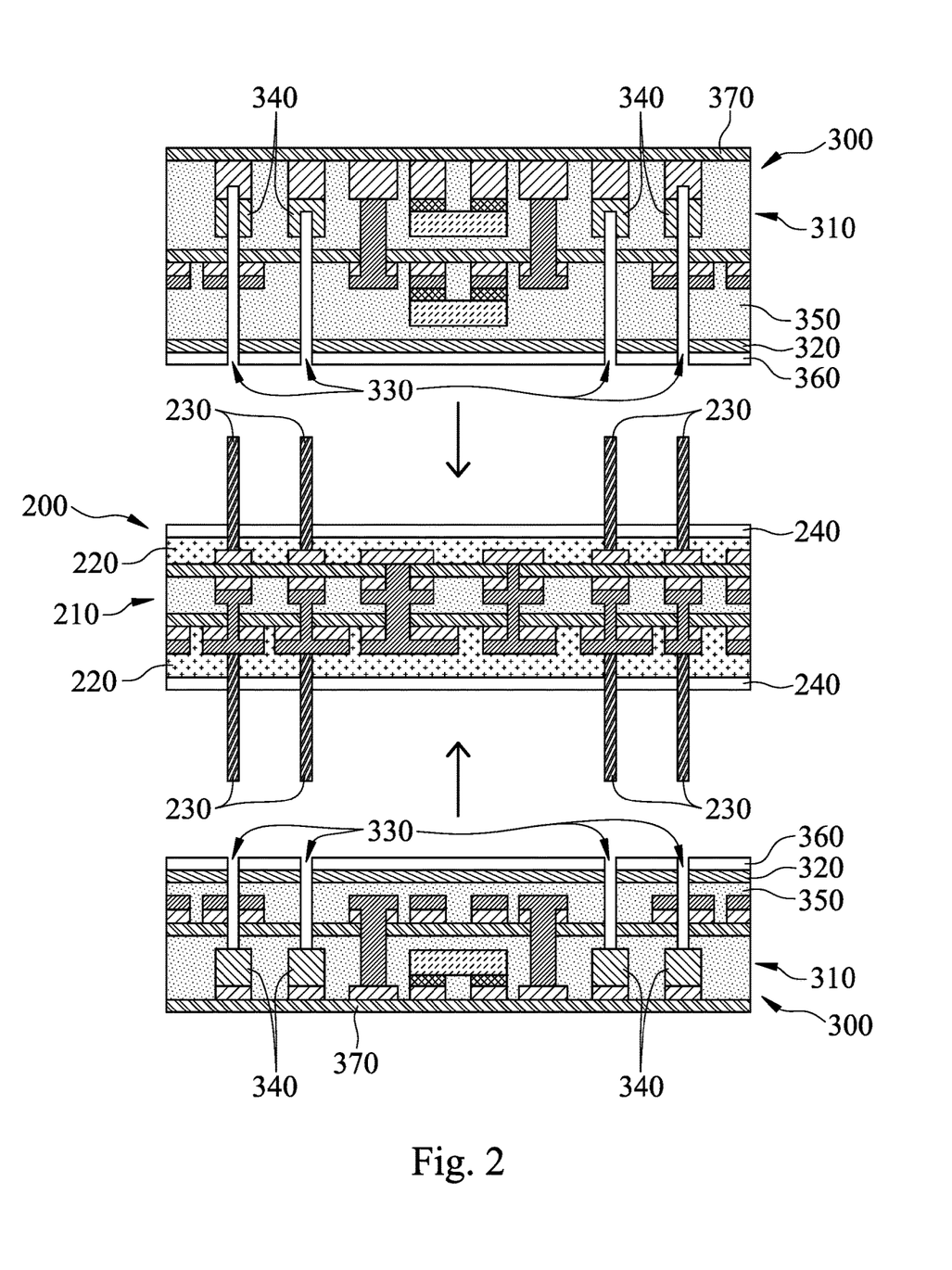
FIG. 2 shows a cross-sectional exploded schematic view of the circuit board assembly of FIG. 1.

Please refer to FIG. 1 and FIG. 2. FIG. 1 shows a cross-sectional schematic view of a circuit board assembly 100 according to an embodiment of the present disclosure. FIG. 2 shows a cross-sectional exploded schematic view of the circuit board assembly 100 of FIG. 1. In some embodiments of the present disclosure, the circuit board assembly 100 includes a first circuit board 200.

In detail, the first circuit board 200 includes a first substrate (its number is omitted), a first circuit structure 210, a first magnetic layer 220 and a connecting pillar 230. The first circuit structure 210 is connected to the first substrate. The first magnetic layer 220 is connected to the first circuit structure 210 and makes the first circuit structure 210 be arranged between the first magnetic layer 220 and the first substrate. The first magnetic layer 220 is not electrically connected to the first circuit structure 210, thereby preventing the first magnetic layer 220 affecting the electrical conduction of the first circuit structure 210.

The connecting pillar 230 is connected to the first circuit structure 210. The connecting pillar 230 extends in a direction from the first circuit structure 210 toward the first magnetic layer 220 and through the first magnetic layer 220, and the connecting pillar 230 is electrically connected to the first circuit structure 210. Therefore, the connecting pillar 230 is not only for the first circuit board 200 being located and assembled with other elements, but also for providing the function of circuit conduction. The connecting structure and circuit type of the first circuit board 200 and other elements will be introduced in the following paragraphs, so the details thereof will not be given herein.

In some embodiments, the circuit board assembly 100 further includes a second circuit board 300, and the first circuit board 200 is connected to the second circuit board 300. The second circuit board 300 includes a second circuit structure 310, a second magnetic layer 320 and at least one assembling hole 330. The second magnetic layer 320 is disposed on the second circuit structure 310. The assembling hole 330 forms at the second magnetic layer 320 and makes the second circuit structure 310 be partially exposed in the assembling hole 330. That is, as shown in FIG. 2, the assembling hole 330 can extend from a surface of the second magnetic layer 320 away from the second circuit structure 310 toward the second circuit structure 310, and form a blind-hole structure. However, the assembling hole 330 can be other structures according to the requirements for assembling, and the present disclosure is not limited thereto.

When the first circuit board 200 and the second circuit board 300 are assembled, an attracting magnetic force is generated between the first magnetic layer 220 and the second magnetic layer 320, and the attracting magnetic force makes the first circuit board 200 be connected to the second circuit board 300. In this regard, it can rely on the attraction of the first magnetic layer 220 and the second magnetic layer 320 to achieve the connection and location of the first circuit board 200 and the second circuit board 300. Also, the magnetic force between the first magnetic layer 220 and the second magnetic layer 320 can be larger than the gravities of the first circuit board 200 and the second circuit board 300, so that the first circuit board 200 and the second circuit board 300 do not get separated from each other without applying an external force thereon.

After the first circuit board 200 is connected to the second circuit board 300 by the attracting magnetic force, the connecting pillar 230 is inserted into the assembling hole 330, and the connecting pillar 230 is electrically connected to the second circuit structure 310. Therefore, the electrical conduction between the first circuit board 200 and the second circuit board 300 can be achieved by the connecting pillar 230. It does not need to arrange an opening on the circuit board assembly 100 for cover layer as a mounted area or a reserved opening for other electrical connection. Also, the position of the connecting pillar 230 and the assembling hole 330 can be adjusted to obtain different circuit layout, and it is favorable for enhancing the flexibility of arrangement.

It should be mentioned that, in FIG. 1 and FIG. 2, one first circuit board 200 and two second circuit boards 300 are taken as an example, so the connecting pillar 230 can extend through both sides of the first circuit board 200, and the two second circuit boards 300 can be fixed at the both sides of the first circuit board 200. Also, the first circuit board 200 includes two first magnetic layers 220 to make the two second circuit boards 300 be respectively attracted to the both sides of the first circuit board 200. In other embodiments, the numbers of the first circuit board 200 and the second circuit board 300 can respectively be one, and the second circuit board 300 is assembled on one side of the first circuit board 200. Alternatively, a plurality of second circuit boards 300 can be assembled on one side of the first circuit board 200. Therefore, the present disclosure is not limited to the numbers or assembling positions of the first circuit board 200 and the second circuit board 300.

Furthermore, the second circuit board 300 can further include an electric-conducting layer 340 electrically connected to the second circuit structure 310, and the electric-conducting layer 340 can be electrically connected to at least one of a side surface and an end surface of the connecting pillar 230. In detail, as shown in FIG. 2, the electric-conducting layer 340 can be arranged around the assembling hole 330, be in a U-shape in the cross-sectional view thereof, or only be arranged at the end of the assembling hole 330. When the electric-conducting layer 340 is arranged around the assembling hole 330, the electric-conducting layer 340 can be electrically connected to the side surface of the connecting pillar 230. When the cross-sectional view of the electric-conducting layer 340 is in the U-shape, the electric-conducting layer 340 can be electrically connected to the side surface and the end surface of the connecting pillar 230. When the electric-conducting layer 340 is arranged at the end of the assembling hole 330, the electric-conducting layer 340 can be electrically connected to the end surface of the connecting pillar 230. In this regard, the possibility of poor electrical connection between the connecting pillar 230 and the second circuit structure 310 due to the dimensional error can be reduced.

Moreover, the electric-conducting layer 340 can be made of a conductive silver paste, and the material of the connecting pillar 230 can be copper metal. Because the conductivity of the conductive silver paste is larger than the conductivity of copper metal, the contact resistance from the electrical connection of the connecting pillar 230 and the second circuit structure 310 can be reduced. Furthermore, by arranging the electric-conducting layer 340, the distance between the second circuit structure 310 and the connecting pillar 230 can decrease, and the length of the connecting pillar 230 can further decrease, thereby reducing the difficulty of manufacturing.

A material of the first magnetic layer 220 and the second magnetic layer 320 can include an iron magnetic material or an iron oxide magnetic material, and can further include a polymer material. The polymer material can be epoxy resins, phenolic resins or other resin materials. The polymer material and the iron magnetic material or the iron oxide magnetic material can have a composite structure, such as a core-shell structure (the polymer material is the shell, the iron magnetic material or the iron oxide magnetic material is the core, and vice versa), a sandwich structure (the iron magnetic material or the iron oxide magnetic material is arranged between two layers of the polymer material) or a dispersing structure (the iron magnetic material or the iron oxide magnetic material is dispersed in the polymer material). Furthermore, the iron magnetic material or the iron oxide magnetic material not only provides the magnetic function, but is also used as a shield of electromagnetic signals to prevent the electromagnetic signals interfering with each other.

The iron magnetic material or the iron oxide magnetic material can have relatively larger specific surface area and higher surface energy, and can be made of iron, cobalt, nickel or the alloys thereof, so as to obtain sufficient magnetic effect to assemble and fix the first circuit board 200 and the second circuit board 300. It should be mentioned that, the first magnetic layer 220 and the second magnetic layer 320 do not need to be both permanent magnets, as long as one of the corresponding two magnetic layers is permanent magnet, and the other one of the corresponding two magnetic layers can be magnetized to achieve the purpose of magnetic combination. That is, the embodiments of the first magnetic layer 220 and the second magnetic layer 320 both being permanent magnets or only some of them being permanent magnets are belong to the scope of the present disclosure.

When the material of the first magnetic layer 220 and the second magnetic layer 320 includes the iron magnetic material, the first circuit board 200 can further include a first gel layer (not shown) disposed between the first circuit structure 210 and the first magnetic layer 220, and the second circuit board 300 can further include a second gel layer 350 disposed between the second circuit structure 310 and the second magnetic layer 320, so as to prevent the iron magnetic material interfering in the electrical conduction of the first circuit structure 210 and the second circuit structure 310.

The first circuit board 200 can further include a first waterproof layer 240 connected to the first magnetic layer 220 and making the first magnetic layer 220 be arranged between the first waterproof layer 240 and the first circuit structure 210. The second circuit board 300 can further include a second waterproof layer 360 connected to the second magnetic layer 320 and making the second magnetic layer 320 be arranged between the second circuit structure 310 and the second waterproof layer 360. The first waterproof layer 240 and the second waterproof layer 360 can be elastic and insulating, and the material thereof can be polypropylene (PP) or polyethylene (PE) and the thickness thereof can be less than 50 μm. When the first circuit board 200 and the second circuit board 300 are assembled with each other by the magnetic force, the first waterproof layer 240 and the second waterproof layer 360 are located between the first magnetic layer 220 and the second magnetic layer 320, and deform due to the force of clamping, thereby narrowing the gap between the first circuit board 200 and the second circuit board 300. Therefore, the possibility of liquid or moisture entering the space between the first circuit board 200 and the second circuit board 300 can be reduced, so as to achieve the waterproof ability. Moreover, the first waterproof layer 240 and the second waterproof layer 360 can be a buffer between the first circuit board 200 and the second circuit board 300, thereby reducing the possibility of damage during assembling.

It should be mentioned that, other elements can be embedded in the first circuit board 200 and the second circuit board 300. Also, because the first circuit board 200 and the second circuit board 300 are electrically connected by the connecting pillar 230, the aforementioned other elements do not need to be exposed from the circuit board, thereby giving great protection and extending the service life.

The second circuit board 300 can further include an insulating layer 370 connected to the second circuit structure 310 and making the second circuit structure 310 be arranged between the insulating layer 370 and the second magnetic layer 320. In this regard, by magnetically assembling and arranging the insulating layer 370, the outermost layer of the circuit board assembly 100 can be a structure without opening, so as to ensure that the circuit board assembly 100 has waterproof ability and improve the reliability. The insulating layer 370 can be made of polyimide (PI) which has acid resistance, base resistance and thermal resistance. Also, the insulating layer 370 can provide further waterproof function to maintain the stable operation of the circuit board assembly 100, thereby making the circuit board assembly 100 be suitable for various environments.

Please refer to FIG. 2. A manufacturing method of a circuit board assembly is provided according to another embodiment of the present disclosure, and the manufacturing method of the circuit board assembly includes the following steps. First, a first circuit board 200 and a second circuit board 300 are provided. The structural features of the first circuit board 200 and the second circuit board 300 are as mentioned in the foregoing paragraphs, and the details thereof will not be given again herein.

Next, an attracting magnetic force generated between the first magnetic layer 220 and the second magnetic layer 320 is used to assemble the second circuit board 300 and the first circuit board 200, thereby making the connecting pillar 230 be inserted into the assembling hole 330, and the connecting pillar 230 electrically connected to the second circuit structure 310. In this regard, the connection between multiple circuit boards can be achieved by a magnetic method, without using the conventional manufacturing processes such as solder paste soldering, surface-mount technology (SMT) or anisotropic conductive film connection. The manufacturing cost can be saved and the manufacturing steps and materials can be reduced. Moreover, because the first circuit board 200 and the second circuit board 300 are connected by the magnetic method, it can be separated and reconnected after connection, thereby enhancing the flexibility of assembling and manufacturing.

Figure 3A:
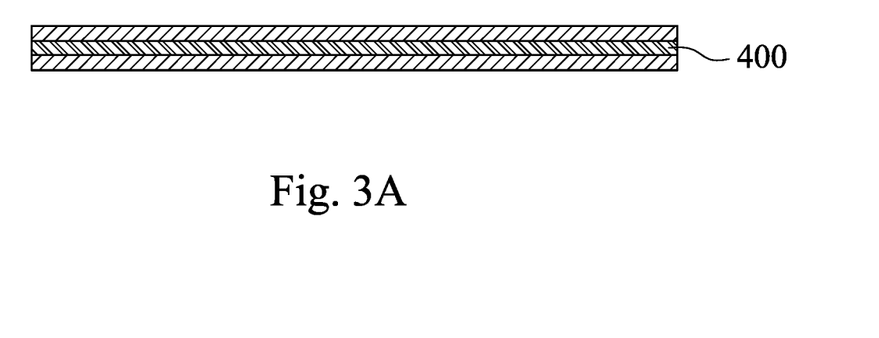
FIG. 3A to FIG. 3L show cross-sectional schematic views of every state of the manufacturing steps of the first circuit board in the manufacturing method of the circuit board assembly according to another embodiment of the present disclosure.

Please refer to FIG. 3A, FIG. 3B, FIG. 3C, FIG. 3D, FIG. 3E, FIG. 3F, FIG. 3G, FIG. 3H, FIG. 3I, FIG. 3J, FIG. 3K and FIG. 3L. FIG. 3A to FIG. 3L show cross-sectional schematic views of every state of the manufacturing steps of the first circuit board 200 in the manufacturing method of the circuit board assembly according to another embodiment of the present disclosure. First, as shown in FIG. 3A, the first substrate 400 is provided. The first substrate 400 can include an insulating structure (its number is omitted) and two copper layers (its number is omitted), and the insulating structure is arranged between the two copper layers. The first substrate 400 can have different structure, so the present disclosure is not limited thereto.

Figure 3B:
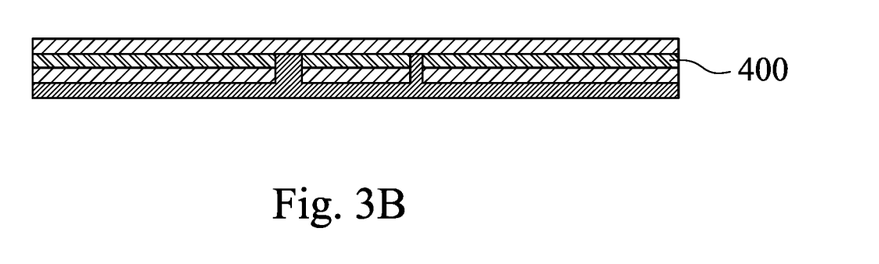
Figure 3C:
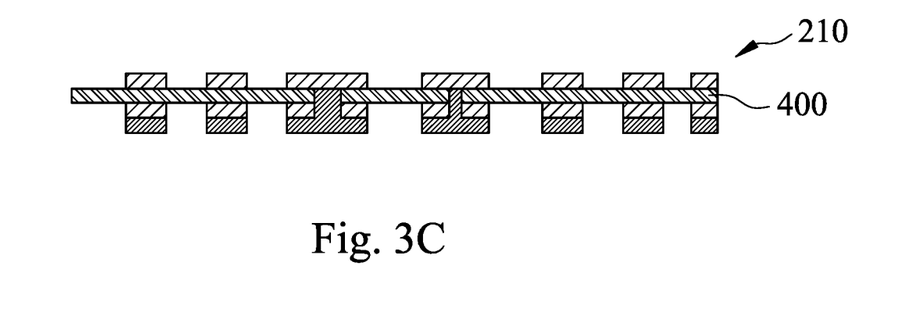

Next, as shown in FIG. 3B and FIG. 3C, a circuit is constructed on the first substrate 400 to obtain the first circuit structure 210. For example, holes can be drilled on the insulating structure of the first substrate 400 and one of the two copper layers and then copper is plated thereon, so that the holes of the first substrate 400 be filled with copper metal to cover the one of the two copper layers, so as to form the structure shown in FIG. 3B. After plating copper, the two copper layers of the first substrate 400 is cut to manufacture the structure shown in FIG. 3C.

Figure 3D:
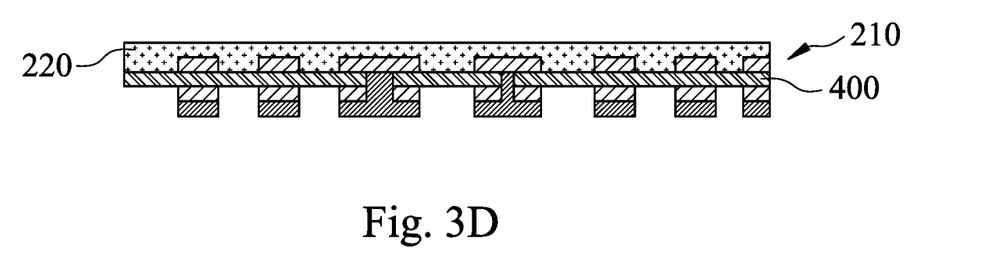
Figure 3E:
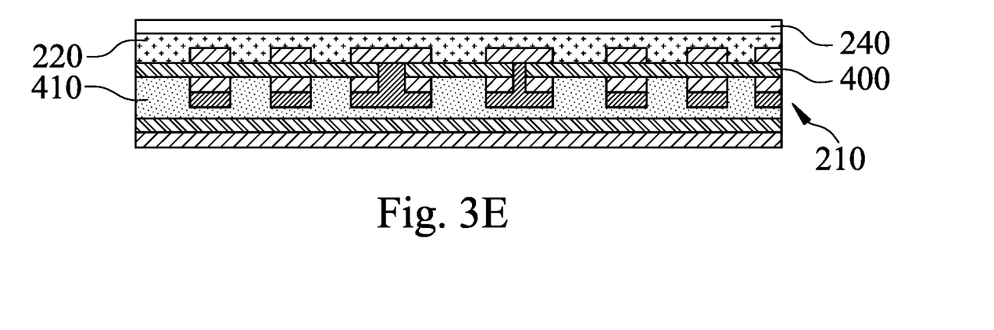
Figure 3F:
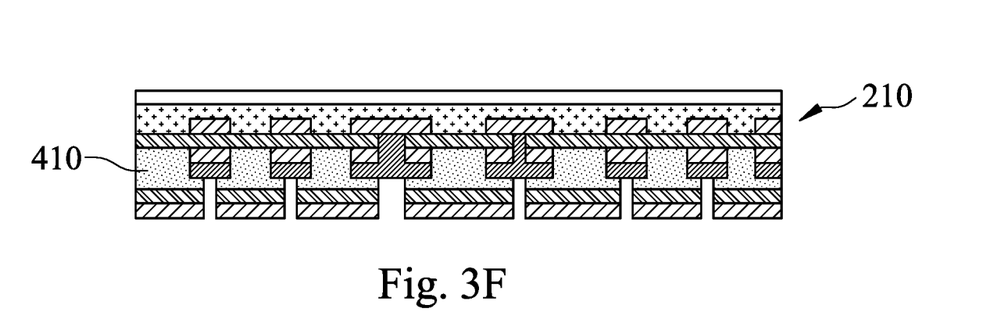
Figure 3G:
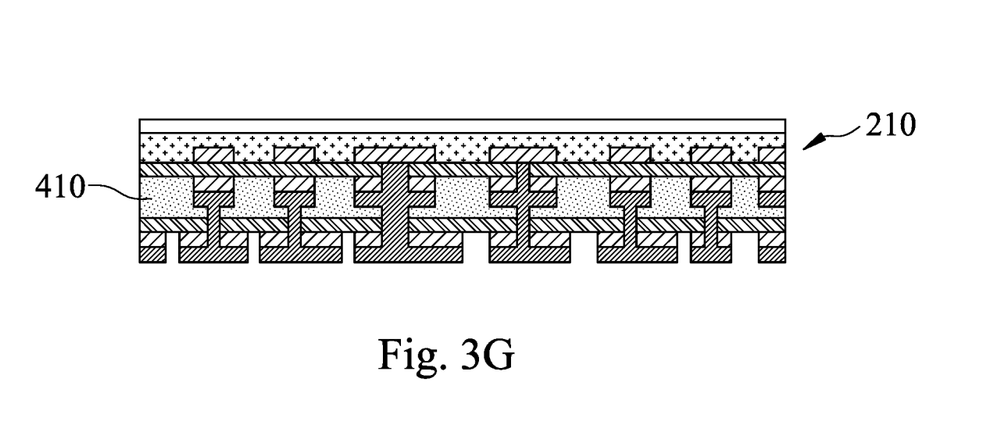
Figure 3H:
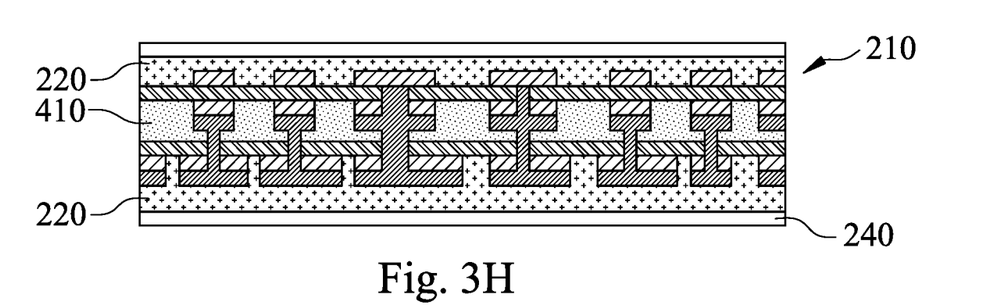

Next, as shown in FIG. 3D to FIG. 3H, the first magnetic layer 220 is connected to a side of the first circuit structure 210, thereby making the first circuit structure 210 be arranged between the first magnetic layer 220 and the first substrate 400. For example, if a number of the first magnetic layer 220 is two, as shown in FIG. 3D, one of the two first magnetic layers 220 can be connected to one side of the first circuit structure 210, and then a first build-up structure 410 is arranged on the other side of the first circuit structure 210, so as to form the structure shown in FIG. 3E. Next, the manufacturing processes such as cutting and copper-plating are performed on the first build-up structure 410, so as to form the structures shown in FIG. 3F and FIG. 3G. Then, the other one of the two first magnetic layers 220 is connected to the first build-up structure 410, thereby making the two first magnetic layers 220 be respectively arranged on the both sides of the first circuit structure 210, so as to obtain the structure shown in FIG. 3H.

It should be mentioned that, after disposing the first magnetic layer 220, a first waterproof layer 240 can be further disposed on the first magnetic layer 220, thereby making the first magnetic layer 220 be arranged between the first waterproof layer 240 and the first circuit structure 210. The numbers of the first waterproof layer 240 and the first magnetic layer 220 can be the same. In this embodiment, the number of the first waterproof layer 240 can be two. Also, as shown in FIG. 3D to FIG. 3H, the first waterproof layer 240 can be disposed with the corresponding first magnetic layer 220 at the same time, or be disposed on the two first magnetic layers 220 after the two first magnetic layers 220 are all disposed. Therefore, the timing for disposing the first waterproof layer 240 is not limited in the present disclosure.

Figure 3I:
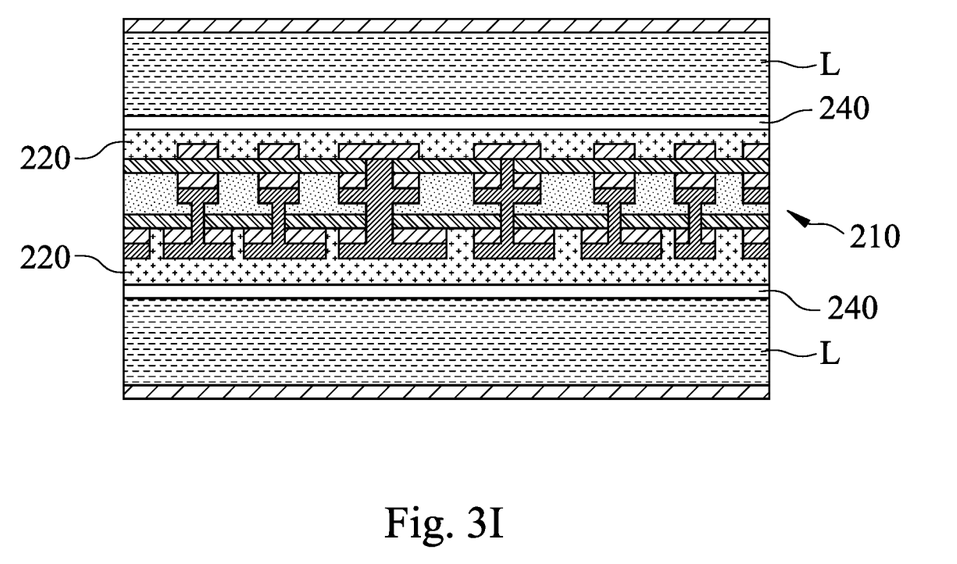
Figure 3J:
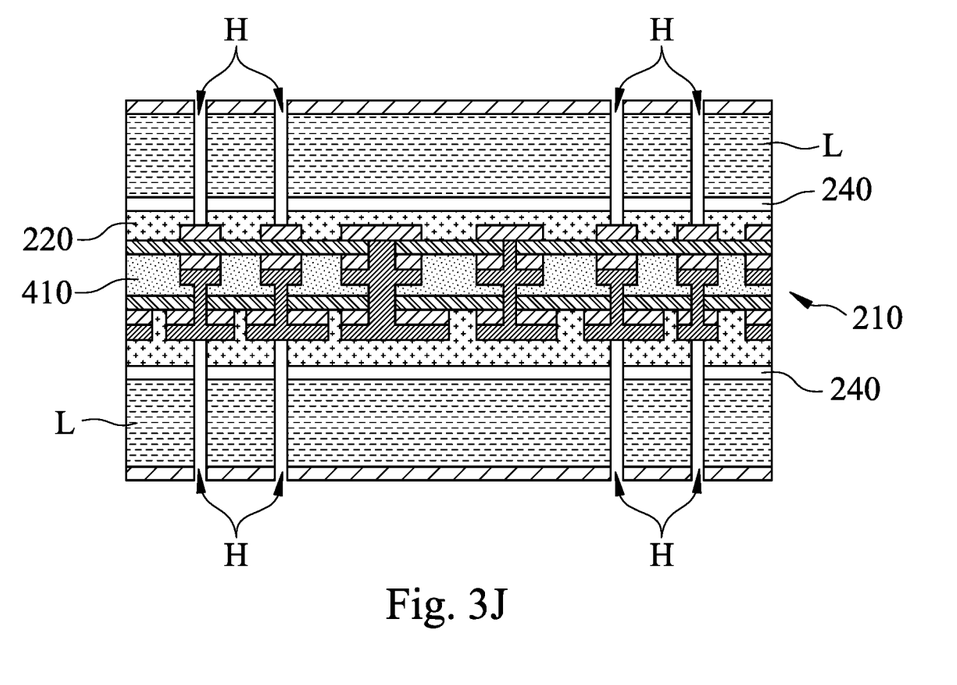

Next, as shown in FIG. 3I and FIG. 3J, a releasing layer L and the first magnetic layer 220 are connected, so the first magnetic layer 220 be arranged between the releasing layer L and the first circuit structure 210. Then, the first magnetic layer 220 and the releasing layer L are cut to form an injecting hole H, wherein the injecting hole H can be extended from the releasing layer L to the first circuit structure 210 or the first build-up structure 410, so as to ensure that the element formed in the following steps can be electrically connected to the first circuit structure 210. Similarly, the numbers of the releasing layer L and the first magnetic layer 220 can be the same, and the present disclosure is not limited to the number of the releasing layer L.

Figure 3K:
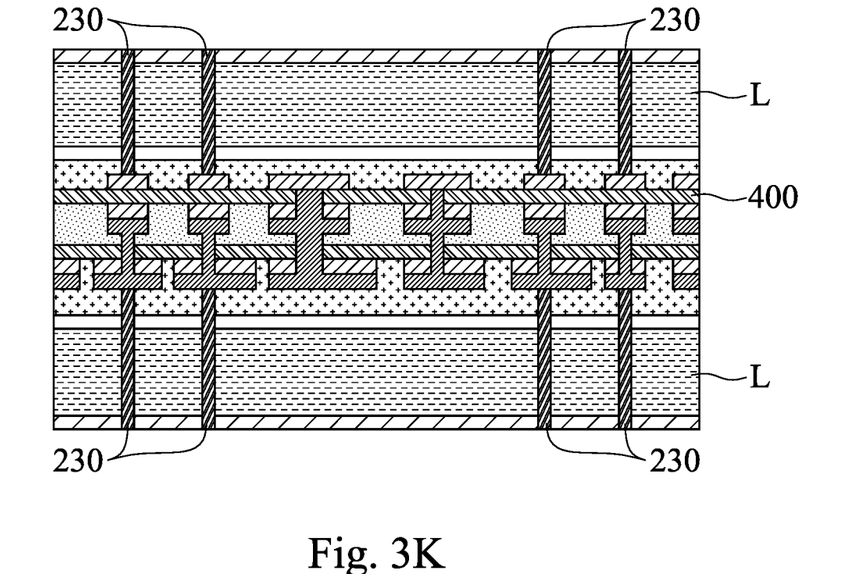
Figure 3L:
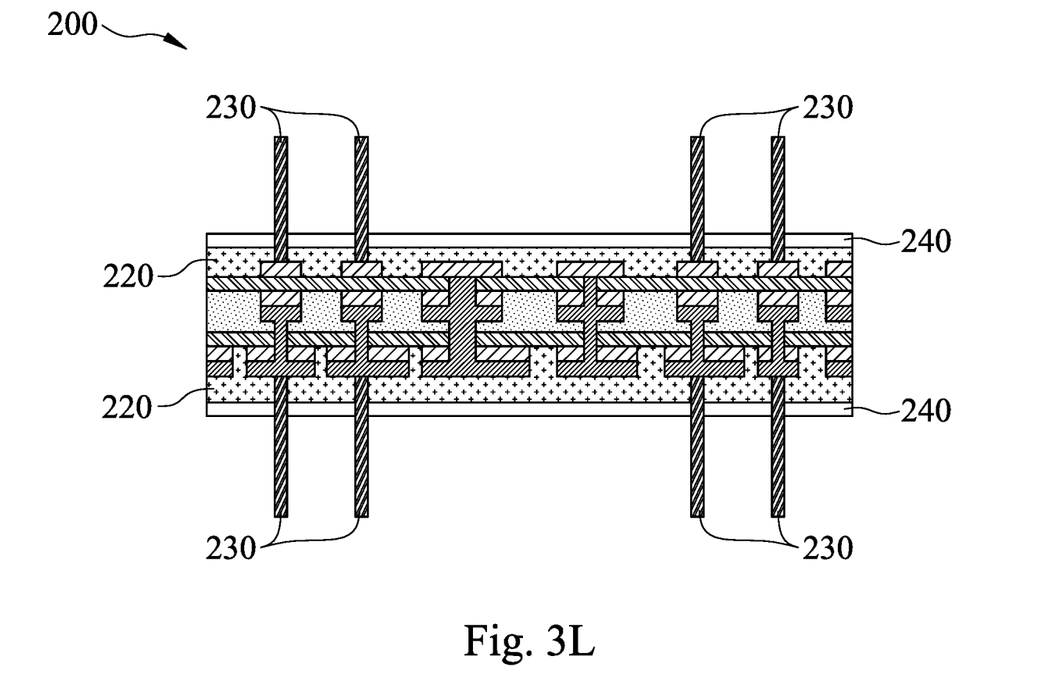

Next, as shown in FIG. 3K and FIG. 3L, an electric-conducting material is injected into the injecting hole H to form the connecting pillar 230. After the setup of the connecting pillar 230 is complete, the releasing layer L is removed to obtain the first circuit board 200.

Figure 4A:
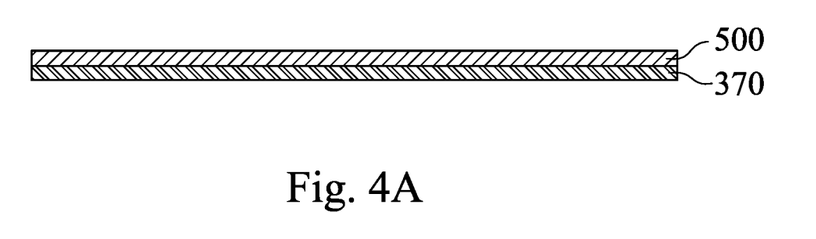
FIG. 4A to FIG. 4K show cross-sectional schematic views of every state of the manufacturing steps of the second circuit board in the manufacturing method of the circuit board assembly according to another embodiment of the present disclosure.

Please refer to FIG. 4A, FIG. 4B, FIG. 4C, FIG. 4D, FIG. 4E, FIG. 4F, FIG. 4G, FIG. 4H, FIG. 4I, FIG. 4J and FIG. 4K. FIG. 4A to FIG. 4K show cross-sectional schematic views of every state of the manufacturing steps of the second circuit board 300 in the manufacturing method of the circuit board assembly according to another embodiment of the present disclosure. First, as shown in FIG. 4A, a second substrate 500 is provided. The second substrate 500 can include an insulating layer 370 and a copper layer (its number is omitted), and the copper layer is disposed on the insulating layer 370.

Figure 4B:
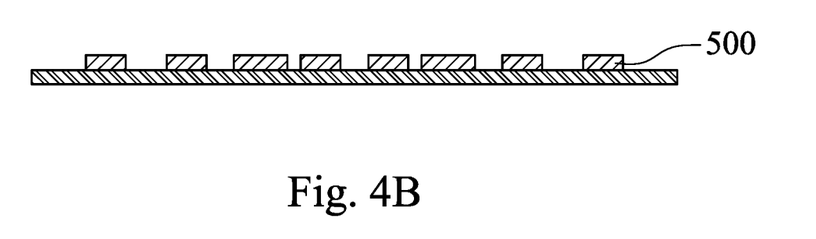
Figure 4C:
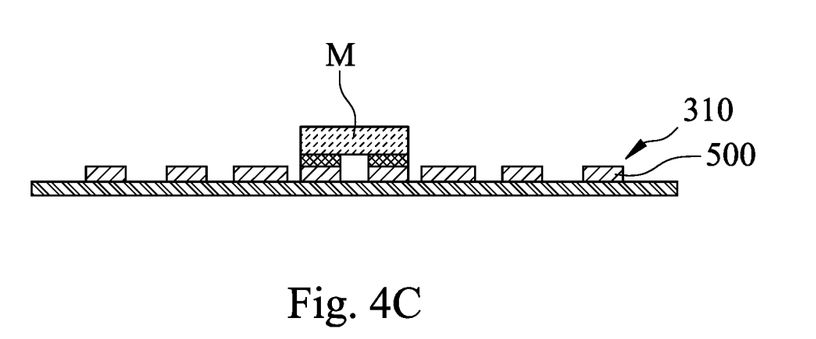

Next, as shown in FIG. 4B to FIG. 4H, a circuit is constructed on the second substrate 500 to obtain the second circuit structure 310. In detail, as shown in FIG. 4B, the copper layer of the second substrate 500 can be cut, and then a mounted element M is disposed on the copper layer by the surface-mount technology, so as to form the structure shown in FIG. 4C.

Figure 4D:
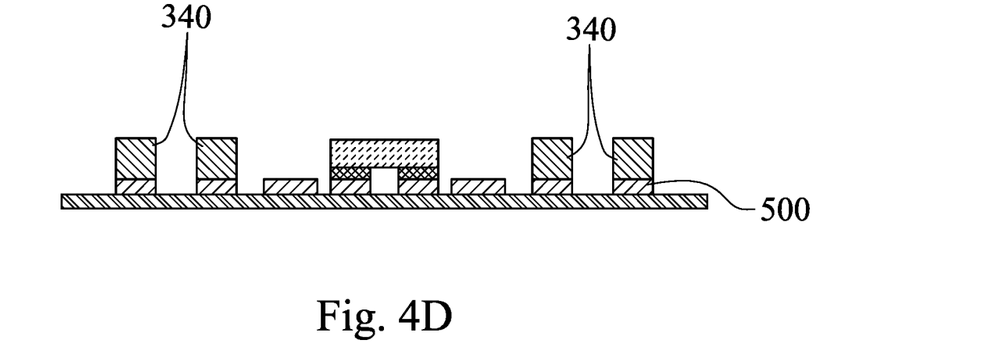
Figure 4E:
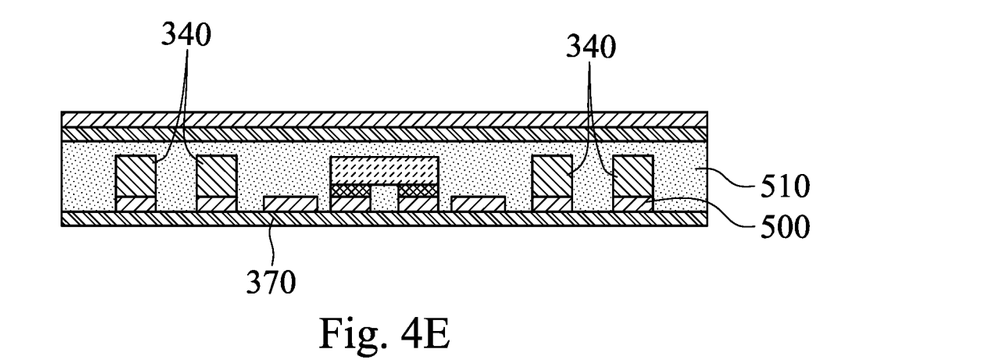
Figure 4F:
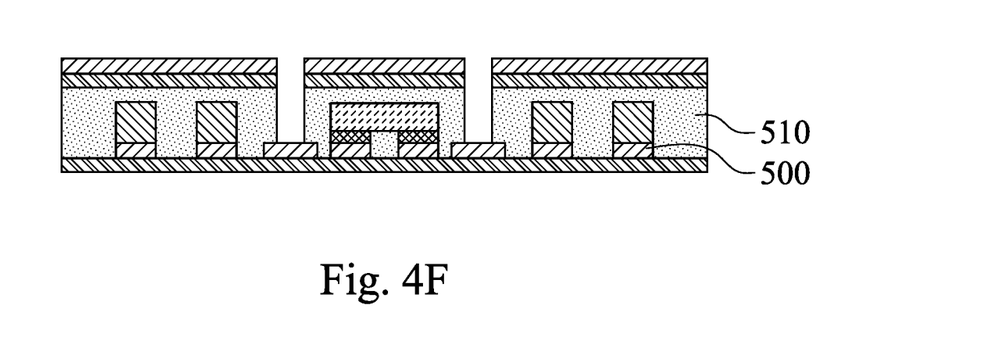
Figure 4G:
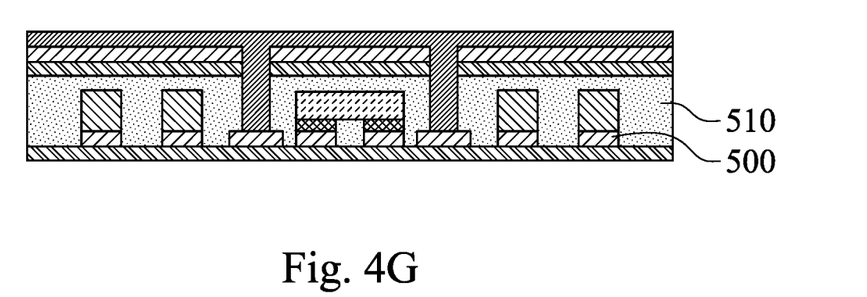
Figure 4H:
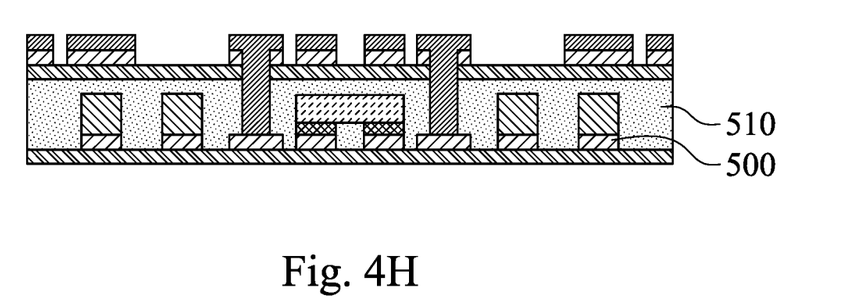

Next, as shown in FIG. 4D, the conductive silver paste is coated on the copper layer of the second substrate 500 to form an electric-conducting layer 340, and a second build-up structure 510 is disposed on the second substrate 500 to manufacture the structure shown in FIG. 4E. All of the copper layer of the second substrate 500, the mounted element M and the electric-conducting layer 340 can be covered by the second build-up structure 510, so as to be well protected. Next, the manufacturing processes such as cutting and copper-plating are performed on the second build-up structure 510, so as to form the structures shown in FIG. 4F to FIG. 4H.

Figure 4I:
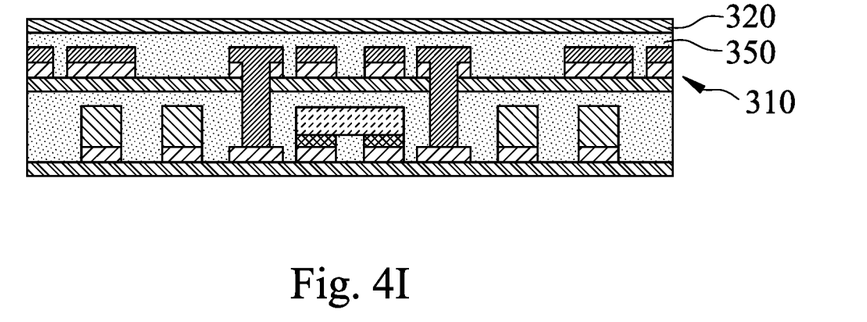

Next, as shown in FIG. 4I, the second magnetic layer 320 is disposed on the second circuit structure 310. It should be mentioned that, if the material of the second magnetic layer 320 is a magnetic material without electrical conductivity, the second magnetic layer 320 can be directly connected to the second circuit structure 310. However, if the material of the second magnetic layer 320 has electrical conductivity, a second gel layer 350 can be disposed and then the second magnetic layer 320 is disposed on the second gel layer 350, which is shown in FIG. 4I, so as to prevent the second magnetic layer 320 interfering in the electrical conduction of the second circuit structure 310. Moreover, before disposing the second magnetic layer 320 or the second gel layer 350, other elements (such as a mounted element) can be disposed on the second circuit structure 310 to meet the requirements for use.

Figure 4J:
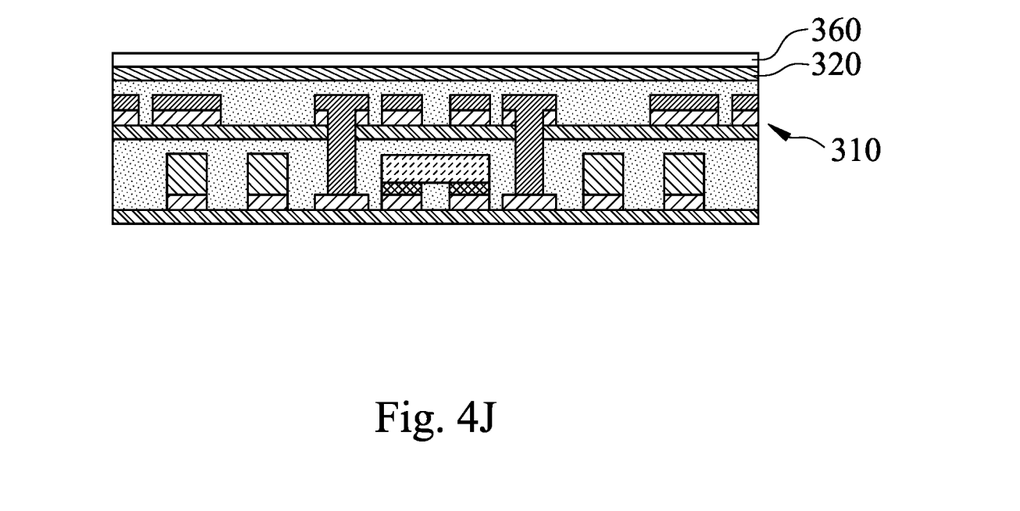
Figure 4K:
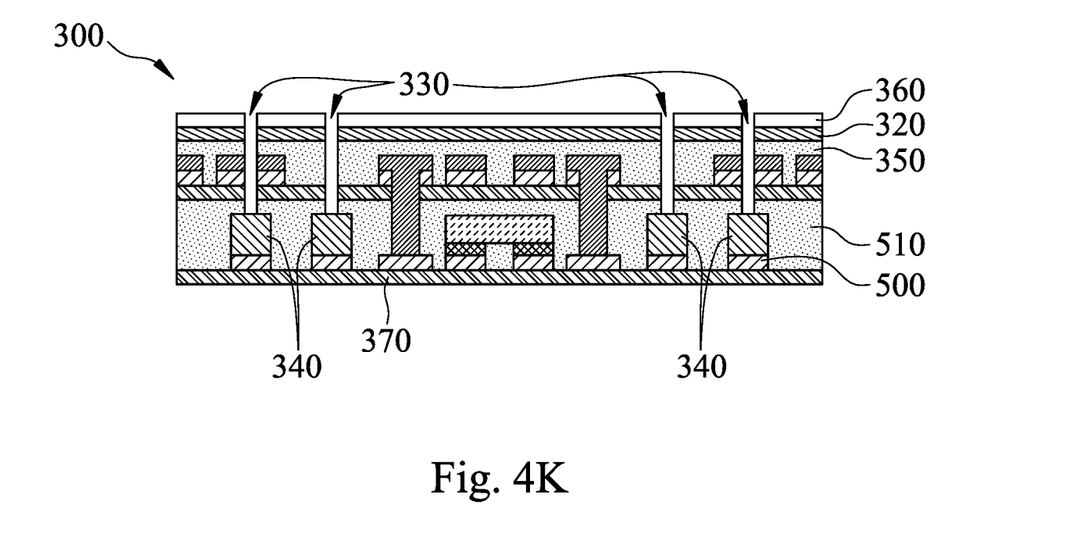

Next, as shown in FIG. 4J, a second waterproof layer 360 can be disposed on the second magnetic layer 320, and then the second magnetic layer 320 and the second circuit structure 310 are cut to form the assembling hole 330, which is shown in FIG. 4K, so as to obtain the second circuit board 300. The end of the assembling hole 330 can be arranged on the surface of the electric-conducting layer 340, in the electric-conducting layer 340 or on the surface of the copper layer after getting through the electric-conducting layer 340. That is, the depth of the assembling hole 330 can be adjusted according to the length of the connecting pillar 230 of the first circuit board 200, and the present disclosure is not limited thereto.

In this regard, the connection and location of the circuit board assembly of the present disclosure and other circuit board assemblies can be achieved by the magnetic function of the magnetic layer. It does not need to rely on the conventional methods such as solder paste soldering or element plugging for connection, and a relatively more flexible arrangement can be obtained. Furthermore, the waterproof layer and the insulating layer can be disposed to enhance the waterproof effect of the circuit board assembly.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A circuit board assembly, comprising:
a first circuit board, comprising:
   a first substrate;
   a first circuit structure, connected to the first substrate;
   a first magnetic layer, connected to the first circuit structure and making the first circuit structure be arranged between the first magnetic layer and the first substrate, wherein the first magnetic layer is not electrically connected to the first circuit structure; and
   a connecting pillar, connected to the first circuit structure, wherein the connecting pillar extends in a direction from the first circuit structure toward the first magnetic layer and through the first magnetic layer, and the connecting pillar is electrically connected to the first circuit structure.

2. The circuit board assembly of claim 1, further comprising:
a second circuit board, comprising:
   a second circuit structure;
   a second magnetic layer, disposed on the second circuit structure; and
   at least one assembling hole, forming at the second magnetic layer and making the second circuit structure be partially exposed in the assembling hole;
wherein an attracting magnetic force is generated between the first magnetic layer and the second magnetic layer, and the attracting magnetic force makes the first circuit board be connected to the second circuit board;
wherein after the first circuit board is connected to the second circuit board by the attracting magnetic force, the connecting pillar is inserted into the assembling hole, and the connecting pillar is electrically connected to the second circuit structure.

3. The circuit board assembly of claim 2, wherein the second circuit board further comprises an electric-conducting layer electrically connected to the second circuit structure, and the electric-conducting layer is electrically connected to at least one of a side surface and an end surface of the connecting pillar.

4. The circuit board assembly of claim 2, wherein a material of the first magnetic layer and the second magnetic layer comprises an iron magnetic material or an iron oxide magnetic material.

5. The circuit board assembly of claim 4, wherein the material of the first magnetic layer and the second magnetic layer comprises the iron magnetic material, the first circuit board further comprises a first gel layer disposed between the first circuit structure and the first magnetic layer, and the second circuit board further comprises a second gel layer disposed between the second circuit structure and the second magnetic layer.

6. The circuit board assembly of claim 2, wherein the second circuit board further comprises a second waterproof layer connected to the second magnetic layer and making the second magnetic layer be arranged between the second circuit structure and the second waterproof layer.

7. The circuit board assembly of claim 1, wherein the first circuit board further comprises a first waterproof layer connected to the first magnetic layer and making the first magnetic layer be arranged between the first waterproof layer and the first circuit structure.

8. A manufacturing method of a circuit board assembly, comprising:
providing a first circuit board, wherein the first circuit board comprises:
   a first substrate;
   a first circuit structure, connected to the first substrate;
   a first magnetic layer, connected to the first circuit structure and making the first circuit structure be arranged between the first magnetic layer and the first substrate, wherein the first magnetic layer is not electrically connected to the first circuit structure; and
   a connecting pillar, connected to the first circuit structure, wherein the connecting pillar extends in a direction from the first circuit structure toward the first magnetic layer and through the first magnetic layer, and the connecting pillar is electrically connected to the first circuit structure;
providing a second circuit board, comprising:
   a second circuit structure;
   a second magnetic layer, disposed on the second circuit structure; and
   at least one assembling hole, forming at the second magnetic layer and making the second circuit structure be partially exposed in the assembling hole; and
using an attracting magnetic force generated between the first magnetic layer and the second magnetic layer to assemble the second circuit board and the first circuit board, wherein the connecting pillar is inserted into the assembling hole, and the connecting pillar electrically connected to the second circuit structure.

9. The manufacturing method of the circuit board assembly of claim 8, wherein manufacturing steps of the first circuit board comprises:
providing the first substrate;
constructing a circuit on the first substrate to obtain the first circuit structure;
connecting the first magnetic layer to a side of the first circuit structure to make the first circuit structure be arranged between the first magnetic layer and the first substrate;
connecting a releasing layer and the first magnetic layer to make the first magnetic layer be arranged between the releasing layer and the first circuit structure;
cutting the first magnetic layer and the releasing layer to form an injecting hole;
injecting an electric-conducting material into the injecting hole to form the connecting pillar; and
removing the releasing layer after the setup of the connecting pillar is complete.

10. The manufacturing method of the circuit board assembly of claim 8, wherein manufacturing steps of the second circuit board comprises:
providing a second substrate;
constructing a circuit on the second substrate to obtain the second circuit structure;

disposing the second magnetic layer on the second circuit structure; and cutting the second magnetic layer and the second circuit structure to form the assembling hole.

11. The manufacturing method of the circuit board assembly of claim 8, wherein the second circuit board further comprises an electric-conducting layer electrically connected to the second circuit structure, and the electric-conducting layer is electrically connected to at least one of a side surface and an end surface of the connecting pillar.

12. The manufacturing method of the circuit board assembly of claim 8, wherein a material of the first magnetic layer and the second magnetic layer comprises an iron magnetic material or an iron oxide magnetic material.

13. The manufacturing method of the circuit board assembly of claim 12, wherein the material of the first magnetic layer and the second magnetic layer comprises the iron magnetic material, the first circuit board further comprises a first gel layer disposed between the first circuit structure and the first magnetic layer, and the second circuit board further comprises a second gel layer disposed between the second circuit structure and the second magnetic layer.

14. The manufacturing method of the circuit board assembly of claim 8, wherein the second circuit board further comprises a second waterproof layer connected to the second magnetic layer and making the second magnetic layer be arranged between the second circuit structure and the second waterproof layer.

15. The manufacturing method of the circuit board assembly of claim 8, wherein the first circuit board further comprises a first waterproof layer connected to the first magnetic layer and making the first magnetic layer be arranged between the first waterproof layer and the first circuit structure.

* * * * *